(12) United States Patent
Soga et al.

(10) Patent No.: US 11,424,240 B2
(45) Date of Patent: Aug. 23, 2022

(54) SEMICONDUCTOR DEVICE AND AMPLIFIER

(71) Applicant: FUJITSU LIMITED, Kawasaki (JP)

(72) Inventors: Ikuo Soga, Isehara (JP); Yoichi Kawano, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/590,775

(22) Filed: Oct. 2, 2019

(65) Prior Publication Data
US 2020/0144249 A1    May 7, 2020

(30) Foreign Application Priority Data

Nov. 1, 2018    (JP) .............................. JP2018-206885

(51) Int. Cl.
*H01L 27/06* (2006.01)
*H01L 23/66* (2006.01)
*H01L 23/495* (2006.01)

(52) U.S. Cl.
CPC ...... *H01L 27/0629* (2013.01); *H01L 23/4951* (2013.01); *H01L 23/4952* (2013.01); *H01L 23/49575* (2013.01); *H01L 23/49589* (2013.01); *H01L 23/66* (2013.01)

(58) Field of Classification Search
CPC ........................... H01L 27/0629; H01L 23/66
See application file for complete search history.

(56) References Cited

U.S. PATENT DOCUMENTS

| | | | |
|---|---|---|---|
| 2013/0161782 A1* | 6/2013 | Rajendran | H01L 23/488 257/506 |
| 2018/0342472 A1* | 11/2018 | Dogiamis | H01L 24/16 |
| 2019/0393226 A1* | 12/2019 | Tanaka | H01L 27/10888 |
| 2020/0219861 A1* | 7/2020 | Kamgaing | H03H 9/0561 |

FOREIGN PATENT DOCUMENTS

JP            11-220344 A         8/1999

* cited by examiner

*Primary Examiner* — Moin M Rahman
*Assistant Examiner* — Mohammad A Rahman
(74) *Attorney, Agent, or Firm* — WHDA, LLP

(57) ABSTRACT

A semiconductor device includes an electric circuit configured to include, a transistor, a first pad coupled to a gate or a drain of the transistor, a second pad coupled to the gate or the drain of the transistor, a first wiring that extends from the gate or the drain of the transistor to the first pad, and a second wiring that diverges from the first wiring and extends to the second pad, and a redistribution layer formed over the electric circuit and configured to include a first redistribution coupled to the first pad, and a second redistribution coupled to the second pad to constitute a stub.

12 Claims, 15 Drawing Sheets

SEMICONDUCTOR DEVICE AND AMPLIFIER

CROSS-REFERENCE TO RELATED APPLICATION

This application is based upon and claims the benefit of the prior Japanese Patent Application No. 2018-206885, filed on Nov. 1, 2018, the entire contents of which are incorporated herein by reference.

FIELD

The embodiments discussed herein are related to a semiconductor device and an amplifier.

BACKGROUND

A semiconductor chip in which an output pad connected to a drain of a transistor and a drain pad for applying a bias voltage to the drain of the transistor are provided on a semiconductor substrate is known (see, e.g., Japanese Laid-open Patent Publication No. 11-220344).

Related techniques are disclosed in, for example, Japanese Laid-open Patent. Publication No. 11-220344.

SUMMARY

According to an aspect of the embodiments, a semiconductor device includes an electric circuit configured to include, a transistor, a first pad coupled to a gate or a drain of the transistor, a second pad coupled to the gate or the drain of the transistor, a first wiring that extends from the gate or the drain of the transistor to the first pad, and a second wiring that diverges from the first wiring and extends to the second pad, and a redistribution layer formed over the electric circuit and configured to include a first redistribution coupled to the first pad, and a second redistribution coupled to the second pad to constitute a stub.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

It is desirable, in view of cost reduction, to reduce the size of a semiconductor chip in which an electric circuit is integrated. In order to reduce the size of the semiconductor chip, the use of a Fan Out Wafer Level Package (FOWLP) technology using a redistribution layer may be taken into consideration. In this case, it may be thought that a first redistribution is connected to a pad that is formed on the semiconductor chip and connected to a drain or a gate of a transistor, and a second redistribution that diverges from the first redistribution and constitutes a stub is connected. However, for the manufacturing accuracy, etc. of the FOWLP, in some cases, a distance from the drain or the gate of the transistor to a branch point of the stub may be deviated from a desired value. This may adversely affect the characteristics of transistors.

Hereinafter, with reference to drawings descriptions will be made on embodiments of a technology that makes it possible to reduce the difference between a desired value and a distance from the drain or the gate of the transistor to the branch point of the stub.

First Embodiment

Figure 1A:
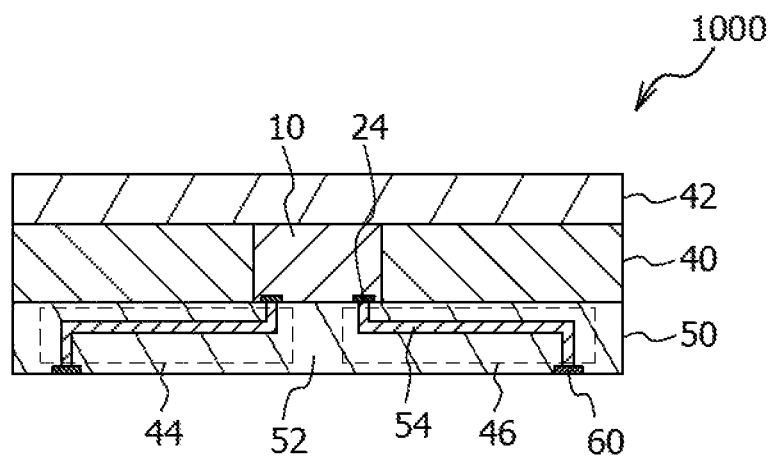
FIG. 1A is a cross-sectional view of a semiconductor device of a Fan Out Wafer Level Package (FOWLP) and FIG. 1B is a cross-sectional view of a semiconductor device of a Chip Size Package (CSP)
Figure 1B:
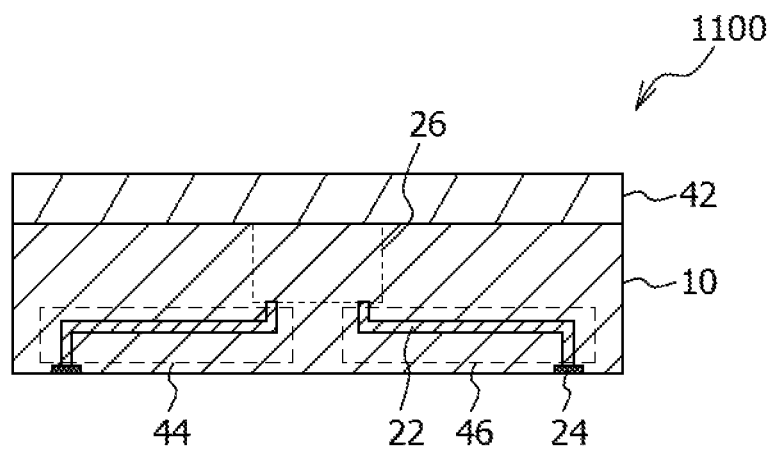

First, a semiconductor device of a Fan Out Wafer Level Package (FOWLP) and a semiconductor device of a Chip Size Package (CSP) will be described. FIG. 1A is a cross-sectional view of a semiconductor device of an FOWLP, and FIG. 1B is a cross-sectional view of a semiconductor device of a CSP. As illustrated in FIG. 1A, a semiconductor device 1000 of an FOWLP includes a semiconductor chip 10, a resin layer 40, and a redistribution layer 50. A transistor, etc. that amplifies high frequency signals is formed on the semiconductor chip 10.

The semiconductor chip 10 is buried in the resin layer 40. On one side surface of the resin layer 40, a pad 24 of the semiconductor chip 10 is exposed from the resin layer 40. On the other side surface of the resin layer 40, a metal film 42 that covers the semiconductor chip 10 and the resin layer 40 is formed. The metal film 42 functions as, for example, a heat spreader.

The redistribution layer 50 is formed on the semiconductor chip 10 and the resin layer 40 on the side where the pad 24 of the semiconductor chip 10 is exposed from the resin layer 40. The redistribution layer 50 includes an insulating portion 52, and a redistribution 54 formed in the insulating portion 52. The redistribution 54 is electrically connected to the pad 24 of the semiconductor chip 10. A pad 60 of the semiconductor device 1000 is formed on the redistribution 54 at the outer layer of the redistribution layer 50. An input matching circuit 44 and an output matching circuit 46 which perform impedance matching of high frequency signals amplified by the semiconductor chip 10 are formed by the redistribution layer 50.

As illustrated in FIG. 1B, as compared to the semiconductor device 1000 of the FOWLP, a semiconductor device 1100 of a CSP does not include the resin layer 40 and the redistribution layer 50. The pad 24 electrically connected to a transistor region 26 of the semiconductor chip 10 via a wiring 22 becomes a pad of the semiconductor device 1100. Since the semiconductor device 1100 of the CSP does not include the resin layer 40 and the redistribution layer 50, the input matching circuit 44 and the output matching circuit 46 are formed in the semiconductor chip 10.

In the semiconductor device 1100 of the CSP, the input matching circuit 44 and the output matching circuit 46 are formed in the semiconductor chip 10. A matching circuit has a size determined by the wavelength band of a signal to be amplified. Thus, when the matching circuit is formed in the semiconductor chip 10, it is difficult to reduce the size of the semiconductor chip 10. As a result, it is difficult to reduce the size of a semiconductor substrate constituting the semiconductor chip 10. It is difficult to reduce the cost when a size reduction of the semiconductor chip 10 is difficult in that in some cases, an expensive semiconductor substrate such as a gallium nitride (GaN) substrate is used for a semiconductor substrate.

Meanwhile, in the semiconductor device 1000 of the FOWLP, the transistor is formed on the semiconductor chip 10 while the input matching circuit 44 and the output matching circuit 46 are formed in the redistribution layer 50. Thus, it is possible to reduce the size of the semiconductor chip 10, and as a result, to reduce the size of the semiconductor substrate constituting the semiconductor chip 10. Therefore, an inexpensive semiconductor device may be obtained by using a FOWLP technology.

Figure 2:
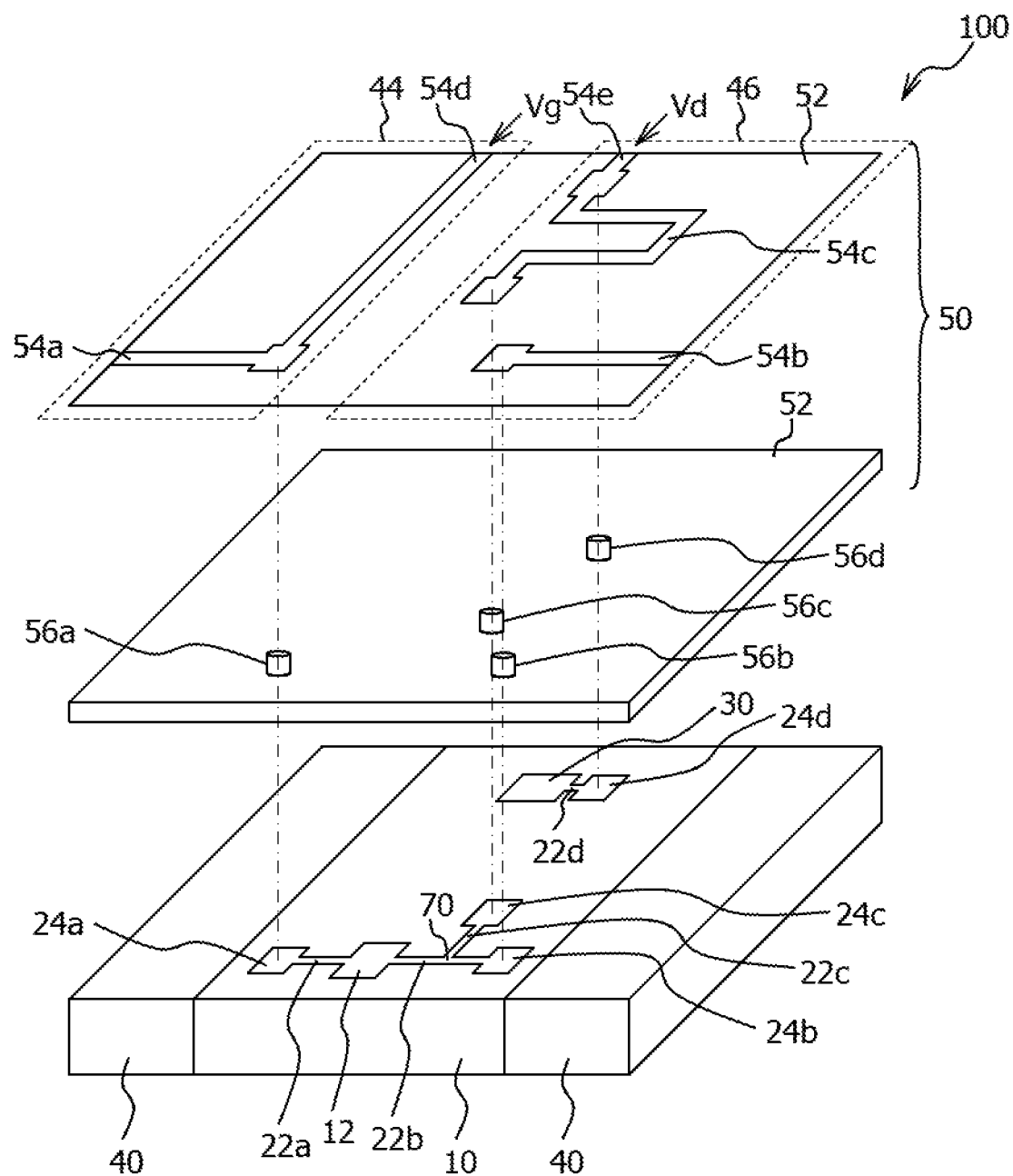
FIG. 2 is an exploded perspective view of the semiconductor device related to a first embodiment.

FIG. 2 is an exploded perspective view of the semiconductor device related to a first embodiment. As illustrated in FIG. 2, a semiconductor device 100 of the first embodiment is a semiconductor device of a FOWLP, which includes the semiconductor chip 10, the resin layer 40, and the redistribution layer 50. A transistor 12, etc. which amplifies high frequency signals is formed on the semiconductor chip 10. The transistor 12 is, for example, a high power transistor capable of performing a high current operation at a high voltage. As an example, a high electron mobility transistor using gallium nitride is employed, but other transistors such as a field effect transistor or a bipolar transistor may be employed.

Figure 3:
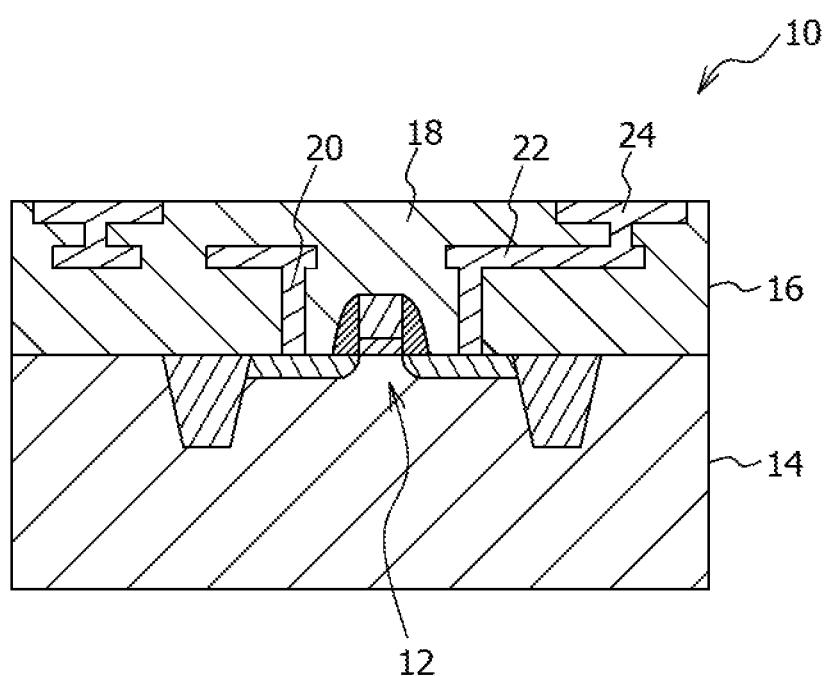
FIG. 3 is a cross-sectional view of a semiconductor chip.

FIG. 3 is a cross-sectional view of the semiconductor chip. As illustrated in FIG. 3, the semiconductor chip 10 includes a semiconductor substrate 14, and a wiring layer 16 formed on the semiconductor substrate 14. The semiconductor substrate 14 is, for example, a gallium nitride substrate, but a silicon substrate, a gallium arsenide substrate, etc. may be employed. A circuit element such as the transistor 12 is formed on the semiconductor substrate 14. The wiring layer 16 includes an insulating portion 18, and a via 20 and a wiring 22 which are provided in the insulating portion 18. The via 20 and the wiring 22 are electrically connected to the circuit element such as the transistor 12. The pad 24 of the semiconductor chip 10 is provided on the wiring 22 at the outer layer of the wiring layer 16.

As illustrated in FIG. 2, the semiconductor chip 10 is buried in the resin layer 40. That is, the resin layer 40 covering the side surfaces of the semiconductor chip 10 is formed on the lateral sides of the semiconductor chip 10. On one side surface of the resin layer 40, pads 24a to 24d of the semiconductor chip 10 are exposed from the resin layer 40. For the resin layer 40, a thermosetting resin, a thermoplastic resin, a UV curable resin, etc. are used. The resin layer 40 may contain a filler such as silicon oxide, aluminum oxide, or silicon nitride.

The redistribution layer 50 is formed on the semiconductor chip 10 and the resin layer 40 on the side where the pads 24a to 24d of the semiconductor chip 10 are exposed from the resin layer 40. The redistribution layer 50 includes the insulating portion 52, redistribution vias 56a to 56d that are formed within the insulating portion 52 and extend in the thickness direction of the redistribution layer 50, and redistributions 54a to 54e that are formed in the insulating portion 52 and extend in a direction intersecting the redistribution vias 56a to 56d. For the insulating portion 52, a resin material such as epoxy, polyimide, or polybenzoxazole is used. For the redistributions 54a to 54e and the redistribution vias 56a to 56d, a conductive material such as copper or aluminum is used.

The pad 24a of the semiconductor chip 10 is an input pad connected to a gate of the transistor 12 via a wiring 22a and to which a high frequency signal to be amplified by the transistor 12 is input. The redistribution via 56a, the redistribution 54a, and the redistribution 54d are electrically connected to the pad 24a, and the high frequency signal is input via the redistribution 54a and the redistribution via 56a. A bias voltage Vg is supplied to the gate of the transistor 12 via the redistribution 54d. The input matching circuit 44 that performs an impedance matching of the high frequency signals input to the transistor 12 is formed by using the redistribution layer 50, that is, formed by using the redistributions 54a and 54d.

The pad 24b of the semiconductor chip 10 is an output pad connected to a drain of the transistor 12 via a wiring 22b and from which the high frequency signal amplified by, the transistor 12 is output. The redistribution via 56b and the redistribution 54b are electrically connected to the pad 24b. The high frequency signal amplified by the transistor 12 is output to the outside of the semiconductor device 100 via the redistribution via 56b and the redistribution 54b. Accordingly, the redistribution 54b electrically connected to the pad 24b constitutes a transmission line through which the high frequency signal is transmitted. The pad 24c is electrically connected to a wiring 22c that diverges from a branch point 70 of the wiring 22b.

The pad 24d is electrically connected to the pad 24c via the redistribution via 56d, the redistribution 54c, and the redistribution via 56c. A capacitor 30 is electrically connected to the pad 24d via a wiring 22d. One terminal of the capacitor 30 is connected to the pad 24d via the wiring 22d, and the other terminal is connected to a ground potential. A bias voltage Vd is supplied to the drain of the transistor 12 via the redistributions 54e and 54c. Accordingly, the redistribution 54c electrically connected to the pad 24c constitutes a short stub. The capacitor 30 electrically connected to the pad 24d plays a role of stabilizing the bias voltage Vd. The output matching circuit 46 that performs impedance matching of the high frequency signals output from the transistor 12 is formed by using the redistribution layer 50, that is, formed by using the redistributions 54b and 54c.

Figure 4:
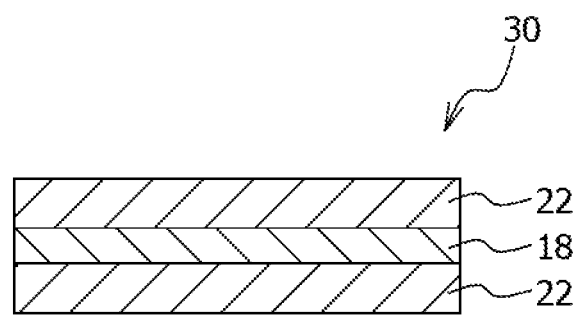
FIG. 4 is a cross-sectional view of a capacitor.

FIG. 4 is a cross-sectional view of the capacitor. As illustrated in FIG. 4, the capacitor 30 is a Metal-Insulator-Metal (MIM) capacitor in which the insulating portion 18 is interposed between the wirings 22. The capacitor 30 may be any capacitor other than the MIM capacitor such as, for example, a chip component of a capacitor.

Figure 5:
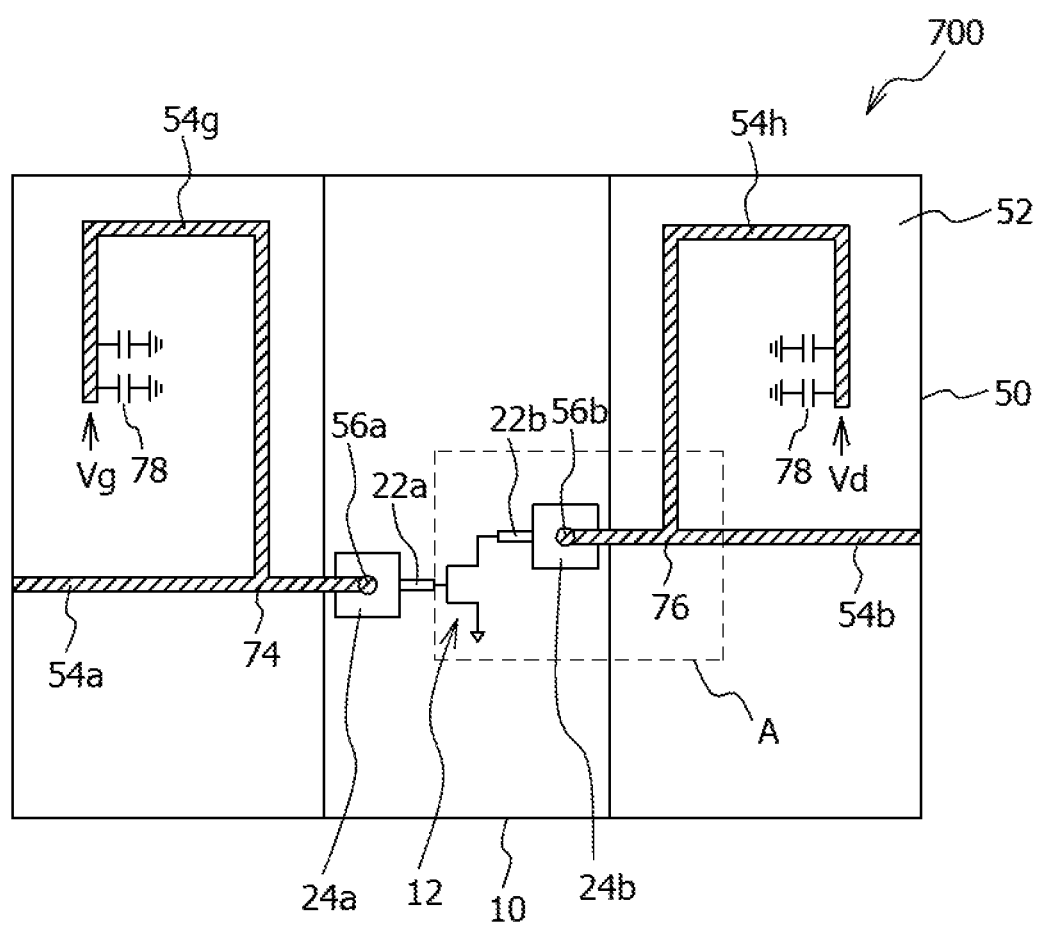
FIG. 5 is a view illustrating a semiconductor device related to a first comparative example.

FIG. 5 is a view illustrating a semiconductor device related to a first comparative example. In FIG. 5, in order to clarify the drawing the redistributions formed in the redistribution layer 50 are hatched. As illustrated in FIG. 5, in a semiconductor device 700 of the first comparative example, the edistribution via 56a and the redistribution 54a are connected to the pad 24a connected to the gate of the transistor 12, and a redistribution 54g diverging from a branch point 74 of the redistribution 54a is formed. A capacitor 78 is connected to the end portion of the redistribution 54g opposite to the branch point 74. The redistribution 54g constitutes a short stub. The bias voltage Vg is supplied to the gate of the transistor 12 via the redistribution 54g.

Likewise, the redistribution via 56b and the redistribution 54b are connected to the pad 24b connected to the drain of the transistor 12, and a redistribution 54h diverging from a branch point 76 of the redistribution 54b is formed. The capacitor 78 is connected to the end portion of the redistribution 54h opposite to the branch point 76. The redistribution 54h constitutes a short stub. The bias voltage Vd is supplied to the drain of the transistor 12 via the redistribution 54h.

Figure 6A:
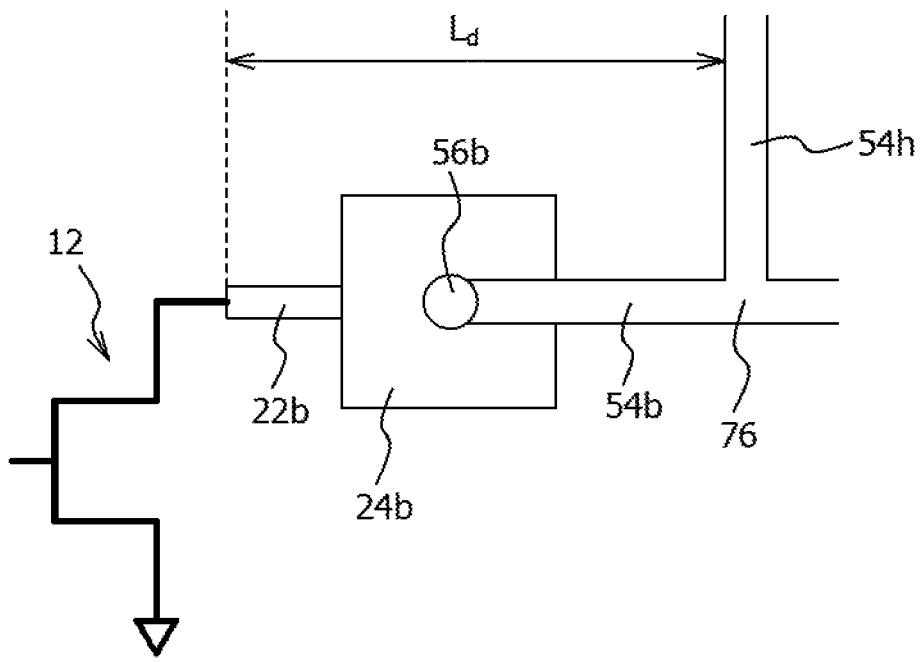
FIGS. 6A and 6B are views for explaining problems occurring in the semiconductor device related to the first comparative example.
Figure 6B:
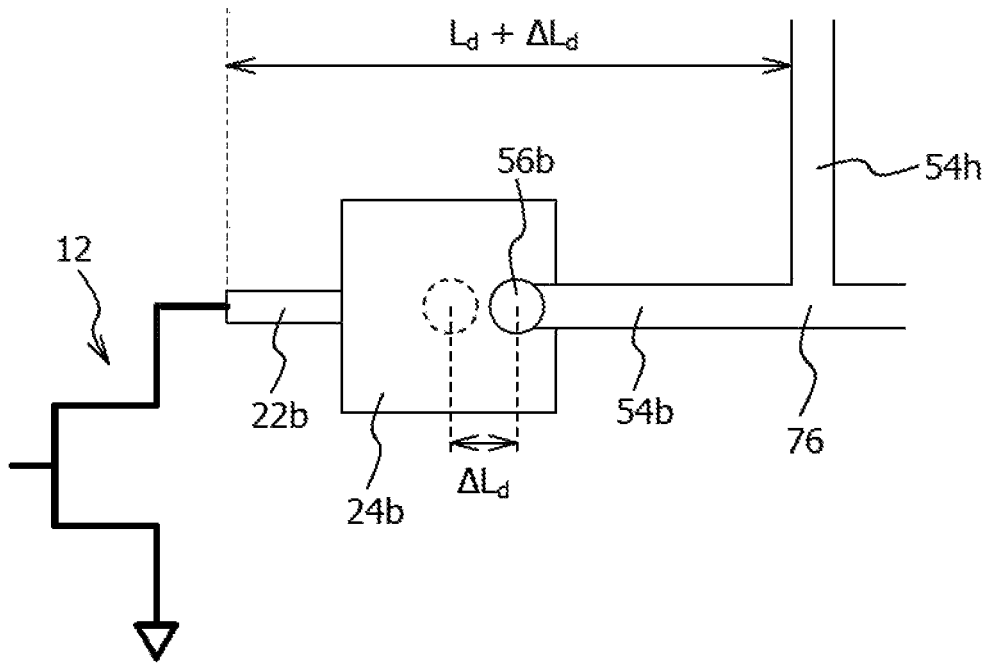

FIGS. 6A and 6B are views for explaining problems occurring in the semiconductor device related to the first comparative example. FIGS. 6A and 6B illustrate a region A in FIG. 5. As illustrated in FIGS. 6A and 6B, for the manufacturing accuracy in the FOWLP, in some cases, the connection position of the redistribution via 56b to the pad 24b provided on the semiconductor chip 10 may be deviated from a desired position. FIG. 6A illustrates a case where the redistribution via 56b is connected to the pad 24b at the desired position, and FIG. 6B illustrates a case where the redistribution via 56b is connected to the pad 24b while being deviated from the desired position. The deviation amount ΔLd of the redistribution via 56b from the desired position may be, for example, about several tens of μm.

When the connection position of the redistribution via 56b is deviated from the desired position, a distance from the drain of the transistor 12 to the branch point 76 at which the redistribution 54h diverges from the redistribution 54b is changed. For example, in a case where the redistribution via 56b is connected to the pad 24b at the desired position, the distance from the drain of the transistor 12 to the branch point 76 is Ld. In this case, when the redistribution via 56b is connected to the pad 24b while being deviated from the desired position by ΔLd, the distance from the drain of the transistor 12 to the branch point 76 may be Ld+ΔLd.

The distance from the drain of the transistor 12 to the branch point 76 of the redistribution 54h constituting the short stub has a great influence on the high frequency signals amplified by the transistor 12, and even a slight deviation causes a performance degradation such as frequency shift and/or reduction of power supply efficiency. That is, in the semiconductor device 700 of the first comparative example, a performance degradation may occur. For example, in the case of a band of 28 GHz used in the 5$^{th}$ generation mobile communication system, since the case where the deviation amount ΔLd is 10 μm corresponds to 1% of the wavelength, the performance degradation may occur.

Figure 7A:
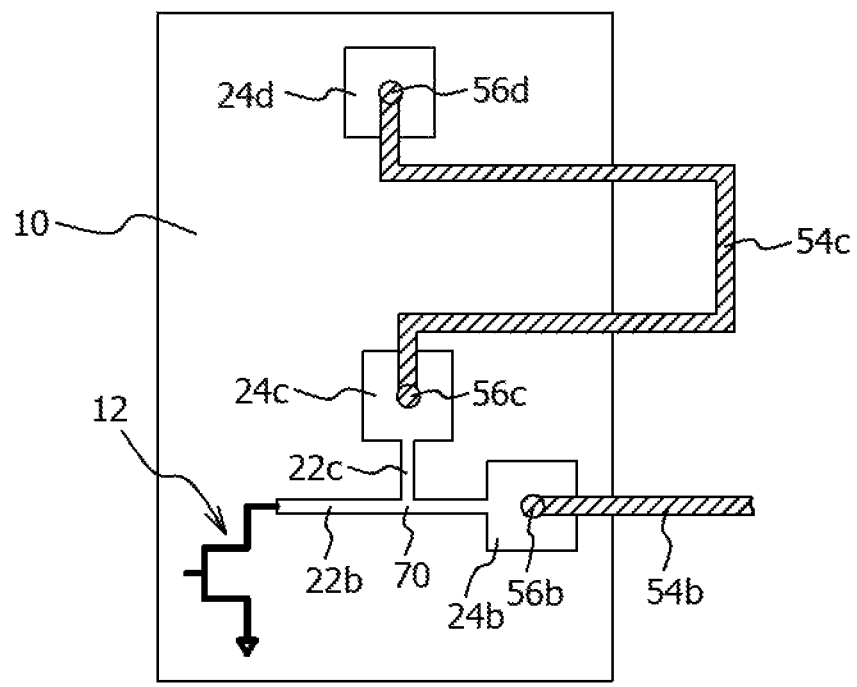
FIGS. 7A and 7B are views for explaining effects of the semiconductor device related to the first embodiment.
Figure 7B:
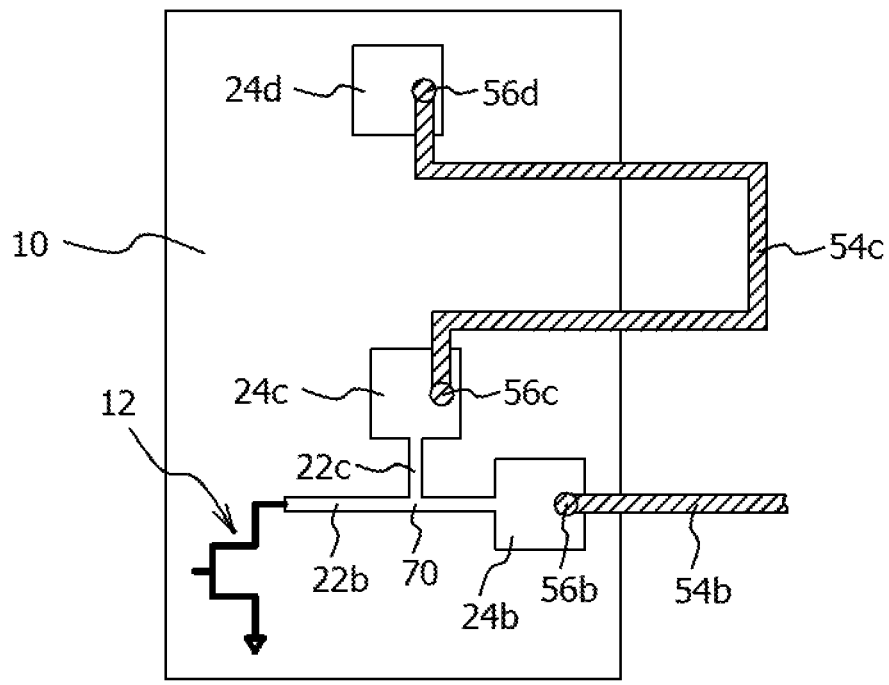

FIGS. 7A and 7B are views for explaining the effects of the semiconductor device related to the first embodiment. In FIGS. 7A and 7B, as illustrated in FIG. 5, the redistributions are hatched. FIG. 7A illustrates a case where the redistribution via 56b is connected to the pad 24b at the desired position, and FIG. 7B illustrates a case where the redistribution via 56b is connected to the pad 24b while being deviated from the desired position. As illustrated in FIGS. 7A and 7B, the redistribution 54c constituting the short stub and the wiring 22c diverge from the wiring 22b at the branch point 70. The branch point 70 is set on the semiconductor chip 10. Thus, even when the connection position of the redistribution via 56b to the pad 24b is deviated from the desired position, it is possible to reduce the difference between a desired value and the distance from the drain of the transistor 12 to the branch point 70.

Figure 8:
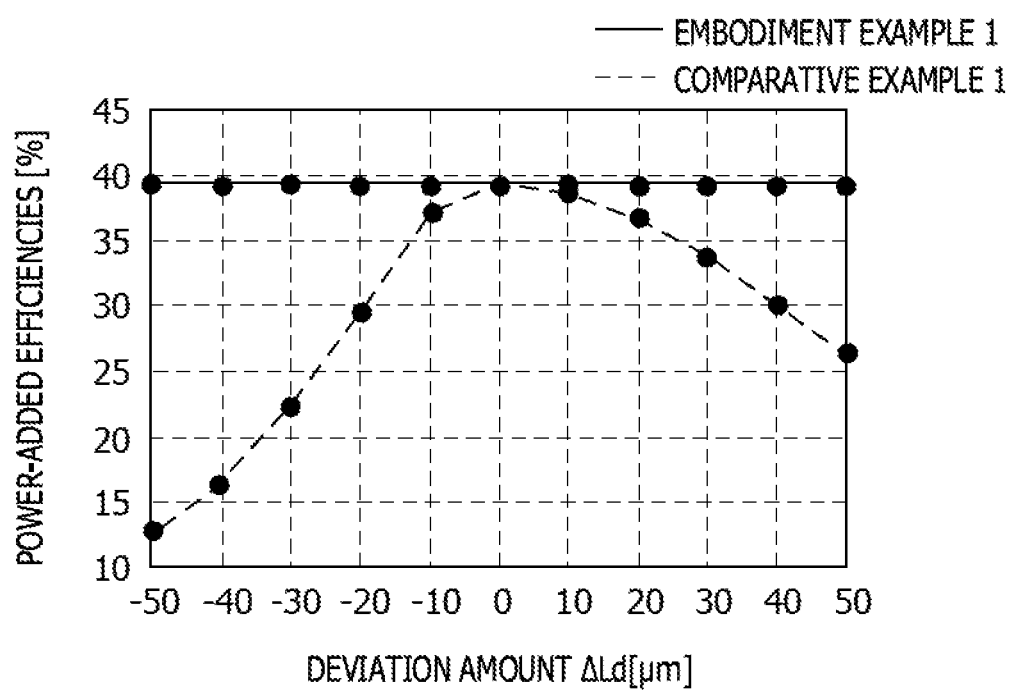
FIG. 8 illustrates simulation results on the power-added efficiencies in the semiconductor device related to the first embodiment and the semiconductor device related to the first comparative example.

FIG. 8 illustrates simulation results on the power-added efficiencies in the semiconductor device related to the first embodiment and the semiconductor device related to the first comparative example. The horizontal, axis of FIG. 8 represents the deviation amount ΔLd from the desired position at the connection position of the redistribution via 56b to the pad 24b (see FIG. 6B). The vertical axis of FIG. 8 represents the power-added efficiency. As illustrated in FIG. 8, in the first comparative example, when the deviation amount ΔLd at the connection position of the redistribution via 56b increases, the power-added efficiency is rapidly reduced. Meanwhile, in the first embodiment, even when the deviation amount ΔLd increases, the power-added efficiency is hardly changed. As described above, in the first embodiment, the performance degradation is suppressed.

According to the first embodiment, as illustrated in FIG. 2, the semiconductor chip 10 includes the pads 24b and 24c connected to the drain of the transistor 12, and the wirings 22b and 22c connecting the drain of the transistor 12 to the pads 24b and 24c. The wiring 22b extends from the drain of the transistor 12 to the pad 24b. The wiring 22c diverges from the wiring 22b and extends to the pad 24c. The pad 24b is connected to the redistribution via 56b and the redistribution 54b of the redistribution layer 50, and the pad 24c is connected to the redistribution via 56c and the redistribution 54c constituting the short stub. Accordingly, as described above with FIGS. 7A and 7B, even when the connection position of the redistribution via 56b to the pad 24b is deviated from the desired position, it is possible to reduce the difference between the desired value and the distance from the drain of the transistor 12 to the branch point 70 of the short stub. Therefore, the performance degradation such as frequency shift and/or reduction of power supply efficiency may be suppressed. In the first embodiment, as an example, a case where the redistribution 54c constitutes the short stub is described, but the redistribution 54c may constitute an open stub as well.

Second Embodiment

Figure 9:
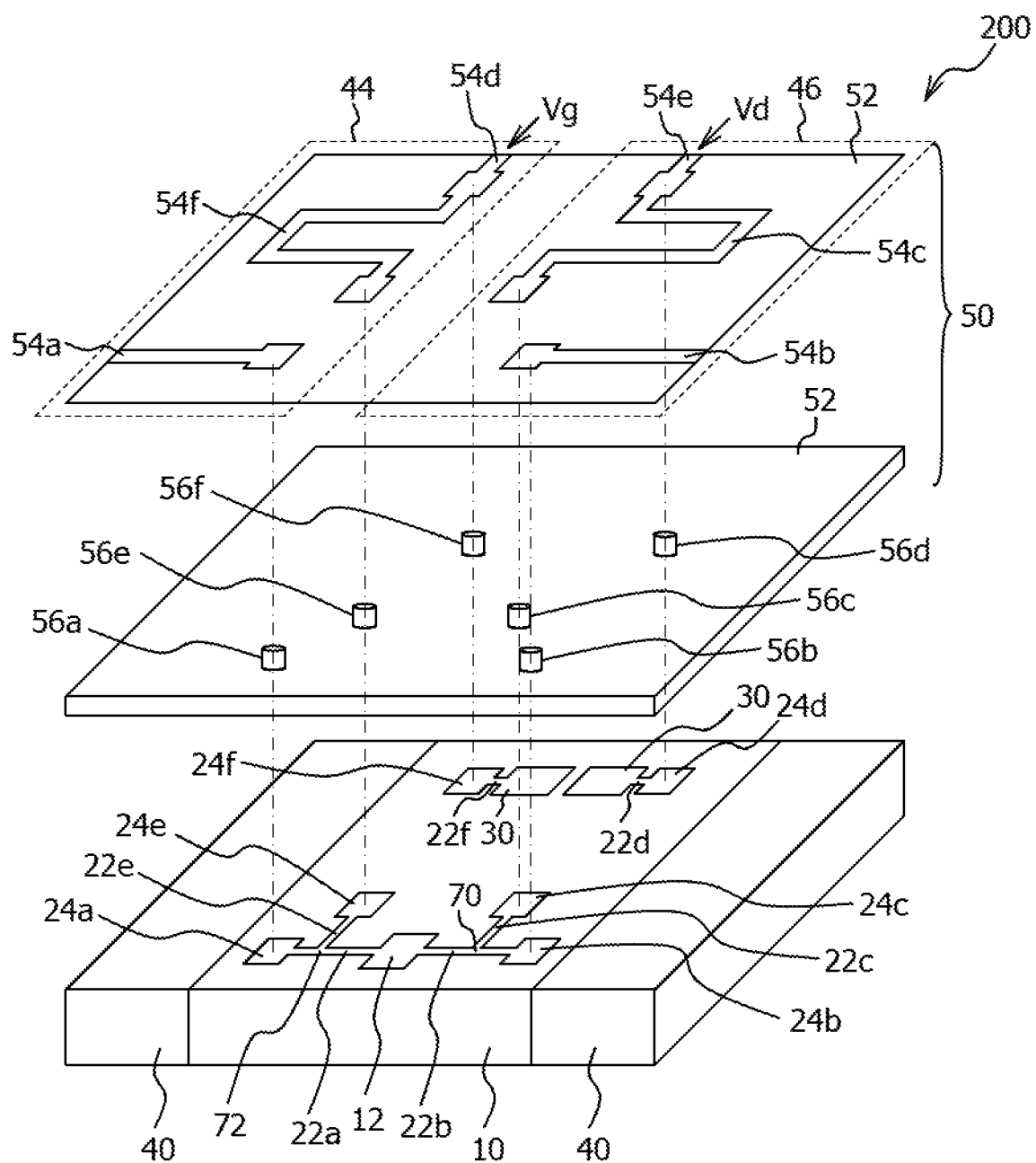
FIG. 9 is an exploded perspective view of a semiconductor device related to a second embodiment.

FIG. 9 is an exploded perspective view of a semiconductor device related to a second embodiment. As illustrated in FIG. 9, in a semiconductor device 200 of the second embodiment, the semiconductor chip 10 includes pads 24e and 24f as well as the pads 24a to 24d. The pad 24e is electrically connected to a wiring 22e diverging from a branch point 72 of the wiring 22a. The pad 24f is electrically connected to the pad 24e via a redistribution via 56f, a redistribution 54f, and a redistribution via 56e. The capacitor 30 is electrically connected to the pad 24f via a wiring 22f. One terminal of the capacitor 30 is connected to the pad 24f via the wiring 22f, and the other terminal is connected to the ground potential. The bias voltage Vg is supplied to the gate of the transistor 12 via the redistributions 54d and 54f. Accordingly, the redistribution 54f electrically connected to the pad 24e constitutes a short stub. The capacitor 30 electrically connected to the pad 24f plays a role of stabilizing the bias voltage Vg. The input matching circuit 44 that performs impedance matching of the high frequency signals input to the transistor 12 is formed by using the redistribution layer 50, that is, formed by using the redistributions 54a and 54f. Other configurations are the same as those in the first embodiment, and thus, descriptions thereof will be omitted.

According to the second embodiment, the semiconductor chip 10 includes the pads 24a and 24e connected to the gate of the transistor 12, and the wirings 22a and 22e connecting the gate of the transistor 12 to the pads 24a and 24e. The wiring 22a extends from the gate of the transistor 12 to the pad 24a, and the wiring 22e diverges from the wiring 22a and extends to the pad 24e. The pad 24a is connected to the redistribution via 56a and the redistribution 54a of the redistribution layer 50, and the pad 24e is connected to the redistribution via 56e and the redistribution 54f constituting the short stub. Thus, it is possible to reduce the difference between a desired value and a distance from the gate of the transistor 12 to the branch point 72 of the short stub. Therefore, the performance degradation such as frequency shift and/or reduction of power supply efficiency may be suppressed.

In the second embodiment, similarly to the gate of the transistor 12 in the first embodiment, the drain of the transistor 12 may be connected only to the pad 24b via the wiring 22b, and the wiring 22c and the pad 24c may not be formed. Therefore, the redistribution vias 56c and 56d and the redistribution 54c may not be formed in the redistribution layer 50, and the redistribution 54e may be connected to the pad 24b via the redistribution via 56b.

Third Embodiment

Figure 10:
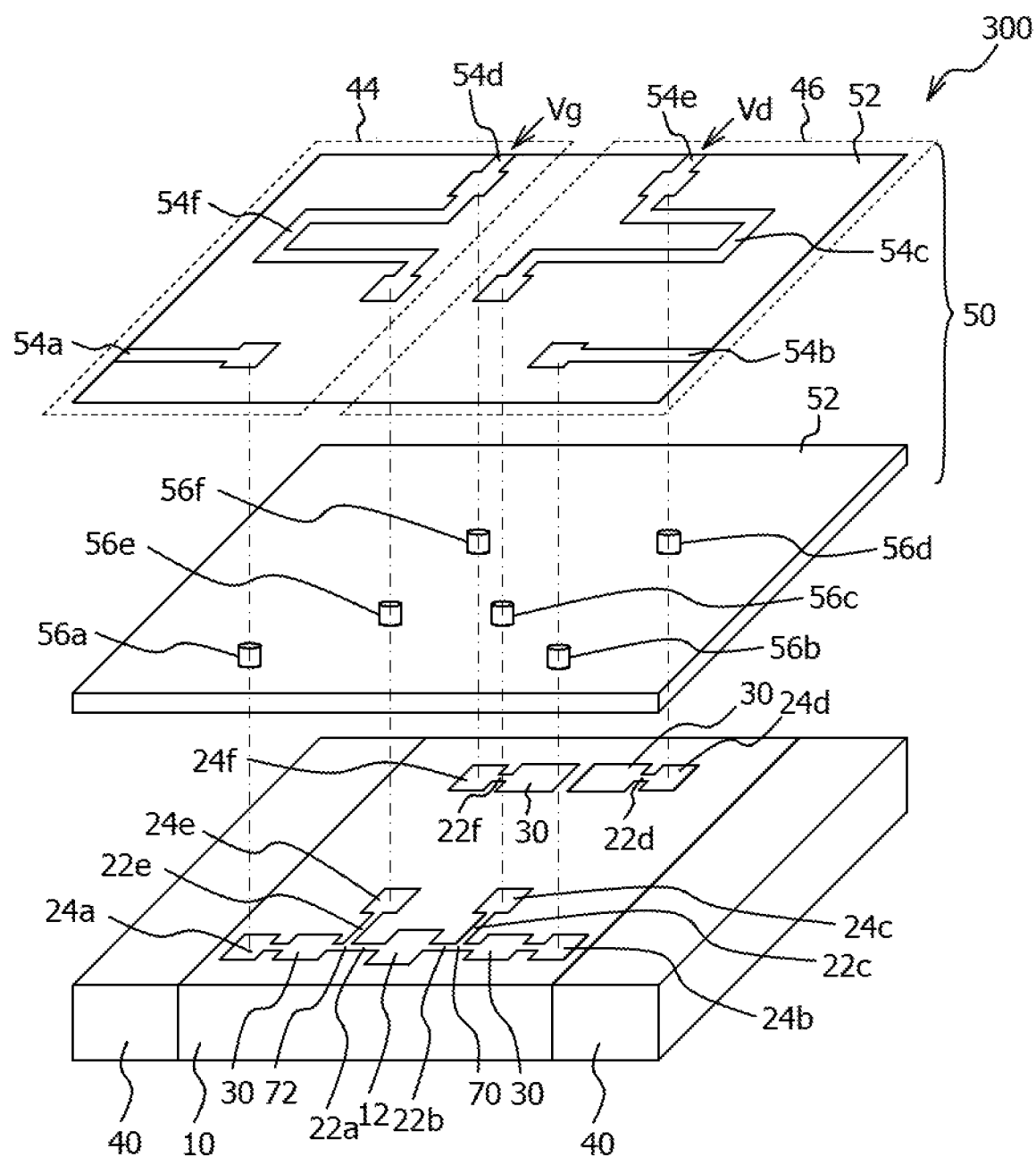
FIG. 10 is an exploded perspective view of a semiconductor device related to a third embodiment.

FIG. 10 is an exploded perspective view of a semiconductor device related to a third embodiment. As illustrated in FIG. 10, in a semiconductor device 300 of the third embodiment, the semiconductor chip 10 includes the capacitor 30 connected between the pad 24a and the branch point 72, and the capacitor 30 connected between the pad 24b and the branch point 70. Other configurations are the same as those in the second embodiment, and thus, descriptions thereof will be omitted.

According to the third embodiment, the semiconductor chip 10 includes the capacitor 30 connected between the pad 24a and the branch point 72, and the capacitor 30 connected between the pad 24b and the branch point 70. The capacitor 30 connected between the pad 24a and the branch point 72 cuts the direct current of the bias voltage Vg supplied to the gate of the transistor 12. Likewise, the capacitor 30 connected between the pad 24b and the branch point 70 cuts the direct current of the bias voltage Vd supplied to the drain of the transistor 12. This makes it possible to connect a plurality of transistors 12 in multiple stages.

In the third embodiment, as an example, a case where the capacitors 30 are connected to both positions between the pad 24a and the branch point 72 and between the pad 24b and the branch point 70 is described, but the capacitor 30 may be connected to either one of the positions.

Fourth Embodiment

Figure 11:
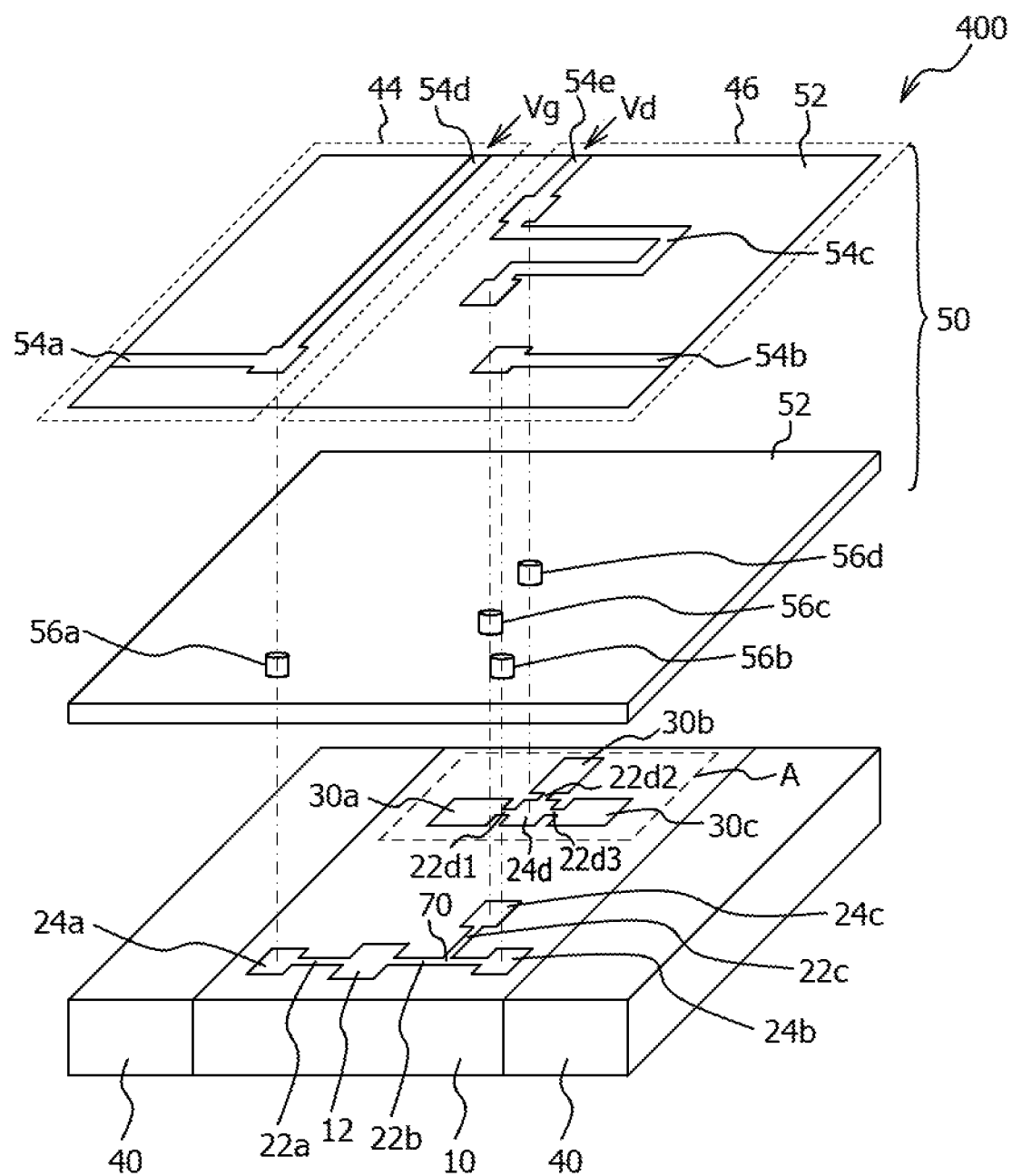
FIG. 11 is an exploded perspective view of a semiconductor device related to a fourth embodiment.

FIG. 11 is an exploded perspective view of a semiconductor device related to a fourth embodiment. As illustrated in FIG. 11, in a semiconductor device 400 of the fourth embodiment, the semiconductor chip 10 includes three capacitors 30a to 30c surrounding the pad 24d in three directions. The capacitors 30a to 30c surround the pad 24d in three directions different from the direction in which the wiring 22c extends from the pad 24c. For example, the capacitors 30a to 30c surround the pad 24d in three directions different from the direction in which the redistribution 54c extends from the redistribution via 56d.

The capacitors 30a to 30c are electrically connected to the pad 24d via wirings 22d1 to 22d3 extending from the pad 24d. The wirings 22d1 to 22d3 extend from the pad 24d in three directions different from the direction in which the wiring 22c extends from the pad 24c. The wiring 22d2 extends from the pad 24d in a direction opposite to the direction in which the wiring 22c extends from the pad 24c. The wirings 22d1 and 22d3 extend from the pad 24d in a direction intersecting (e.g., perpendicular to) the direction in which the wiring 22c extends from the pad 24c.

One terminal of each of the capacitors 30a to 30c is connected to the pad 24d via each of the wirings 22d1 to 22d3, and the other terminal is connected to the ground potential. The lengths of the wirings 22d1 to 22d3 are set as lengths which allow the redistribution 54c to function as a short stub when the redistribution via 56d is connected to a predetermined position (e.g., the center) of the pad 24d. The lengths of the wirings 22d1 to 22d3 may be equal to each other or may be different from each other. Other configurations are the same as those in the first embodiment, and thus, descriptions thereof will be omitted.

Figure 12A:
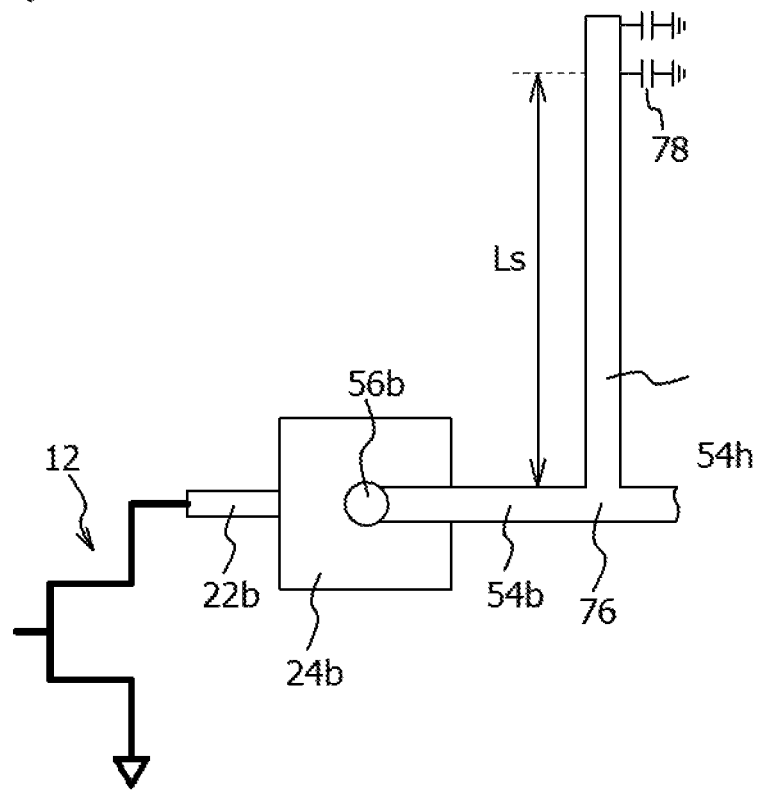
FIGS. 12A and 12B are views for explaining problems occurring in the semiconductor device related to the first comparative example.
Figure 12B:
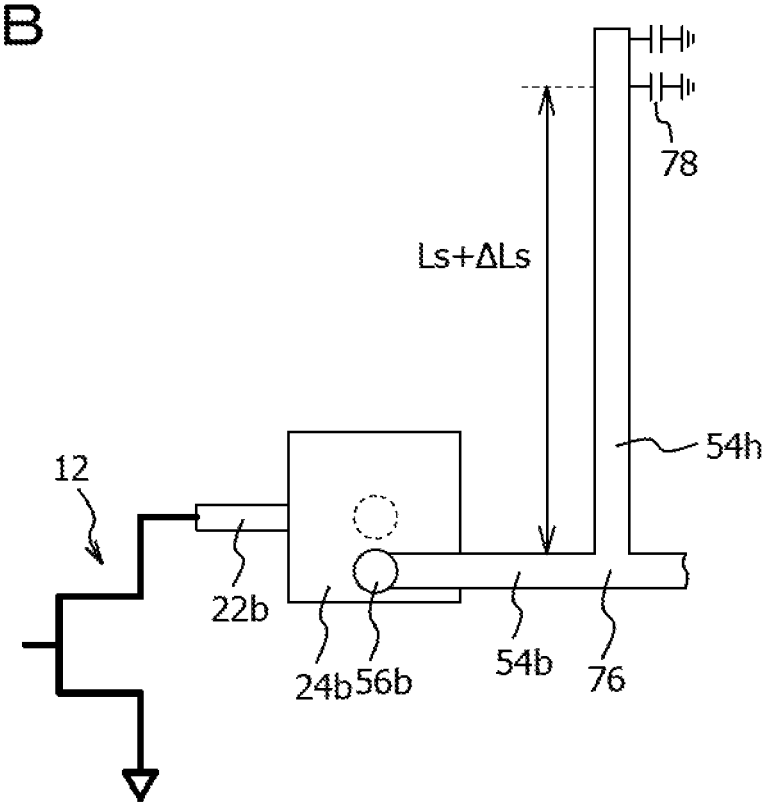

FIGS. 12A and 12B are views for explaining problems occurring in the semiconductor device related to the first comparative example. As illustrated in FIGS. 12A and 12B, for the manufacturing accuracy in the FOWLP, in some cases, the connection position of the redistribution via 56b to the pad 24b may be deviated from a desired position, and a distance from the branch point 76 between the redistribution 54b and the redistribution 54h to the capacitor 78 may be changed. FIG. 12A illustrates a case where the redistribution via 56b is connected to the pad 24b at the desired position, and the distance from the branch point 76 to the capacitor 78 is Ls. FIG. 12B illustrates a case, where the redistribution via 56b is connected to the pad 24b while being deviated from the desired position, and the distance from the branch point 76 to the capacitor 78 is Ls+ΔLs.

The distance from the branch point 76 to the capacitor 78 (i.e., the length of a stub) affects the high frequency signals amplified by the transistor 12, and the difference from a desired distance causes performance degradation such as frequency shift and/or reduction of power supply efficiency. That is, in the semiconductor device 700 of the first comparative example, performance degradation may also occur due to this aspect.

Figure 13A:
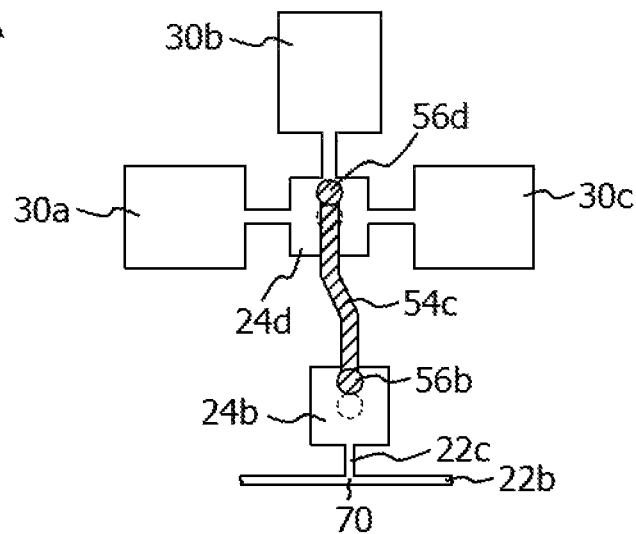
FIGS. 13A to 13C are views for explaining effects of the semiconductor device related to the fourth embodiment.
Figure 13B:
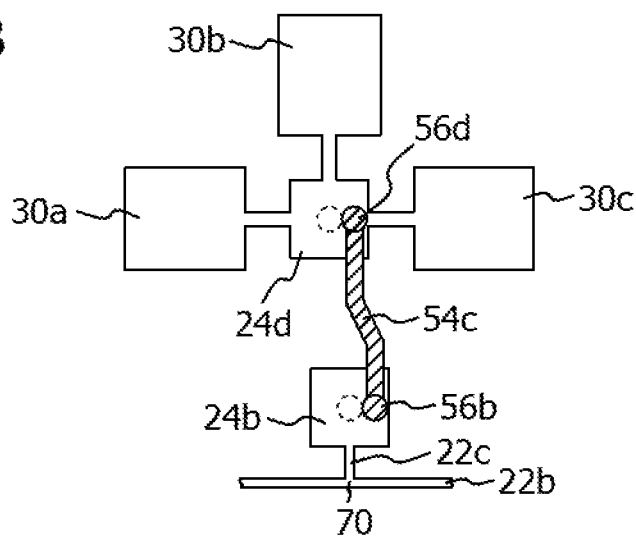
Figure 13C:
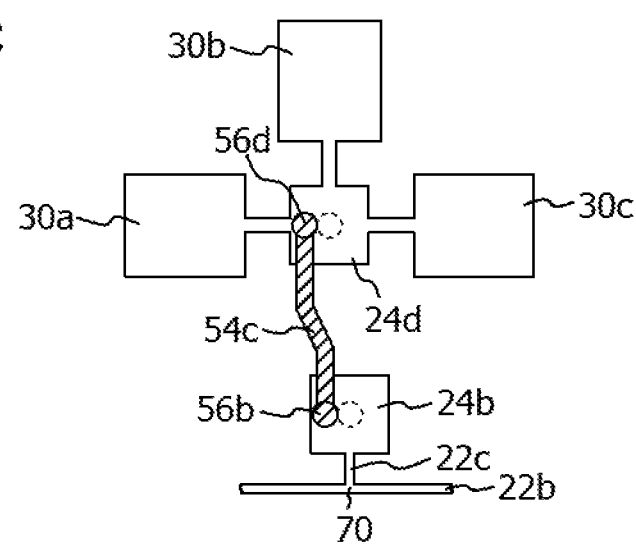

FIGS. 13A to 13C are views for explaining the effects of the semiconductor device related to the fourth embodiment. In FIGS. 13A to 13C, as illustrated in FIG. 5, the redistributions are hatched. As illustrated in FIG. 13A, it is assumed that the connection position of the redistribution via 56b to the pad 24b is deviated from a desired position in a direction toward the pad 24d. In this case, such a deviation between the positions is offset by a deviation in the connection position of the redistribution via 56d to the pad 24d, and the difference between a desired distance and a distance from the branch point 70 to the capacitor 30b may be reduced. Thus, the degradation of performance is suppressed. Likewise, as illustrated in FIGS. 13B and 13C, it is assumed that the connection position of the redistribution via 56b to the pad 24b is deviated from the desired position in a direction intersecting the direction toward the pad 24d. In this case, such a deviation between the positions is offset by a deviation in the connection position of the redistribution via 56d to the pad 24d, and the difference between a desired distance and a distance from the branch point 70 to the capacitor 30a or 30c may be reduced. Thus, the degradation of performance is suppressed.

According to the fourth embodiment, as illustrated in FIG. 11, one end side of the redistribution 54c is connected to the pad 24c by the redistribution via 56c, and the other end side is connected to the pad 24d by the redistribution via 56d. Accordingly, even when the connection position of the redistribution via 56b to the pad 24b is deviated, this deviation may be offset by the deviation in the connection position of the redistribution via 56d to the pad 24d. Thus, when the capacitors 30a to 30c are connected to the pad 24d via the wirings 22d1 to 22d3 extending from the pad 24d, it is possible to reduce the difference between the desired distance and the distance from the branch point 70 of the short stub to the capacitors 30a to 30c. Thus, the degradation of performance may be suppressed.

As illustrated in FIG. 11, it is desirable that the wirings 22d1 to 22d3 extend from the pad 24d in three directions, that is, a direction opposite to the direction in which the wiring 22c extends from the pad 24c and two directions intersecting the direction in which the wiring 22c extends from the pad 24c. It is desirable that the capacitors 30a to 30c are connected to the pad 24d via the wirings 22d1 to 22d3. Accordingly, as described with reference to FIGS. 13A to 13C, even when the connection position of the redistribution via 56b to the pad 24b is deviated from the desired position, it is possible to reduce the difference between the desired distance and the distance from the branch point 70 to one of the capacitors 30a to 30c. Thus, the degradation of performance may be suppressed.

In the fourth embodiment, as an example, a case where the capacitors 30a to 30c are connected to the pad 24d via the wirings 22d1 to 22d3 extending in three directions from the pad 24d is described, but the present disclosure is not limited thereto. As in the first embodiment, one capacitor 30 may be connected via one wiring 22d extending in one direction from the pad 24d. That is, it is desirable that the capacitor 30 is connected to the pad 24d via the wiring 22d extending from the pad 24d in a direction different from the direction in which the wiring 22c extends from the pad 24c. Accordingly, the difference between the desired distance and the distance from the branch point 70 to the capacitor 30 may be reduced, and thus, the degradation of performance may be suppressed.

Figure 14:
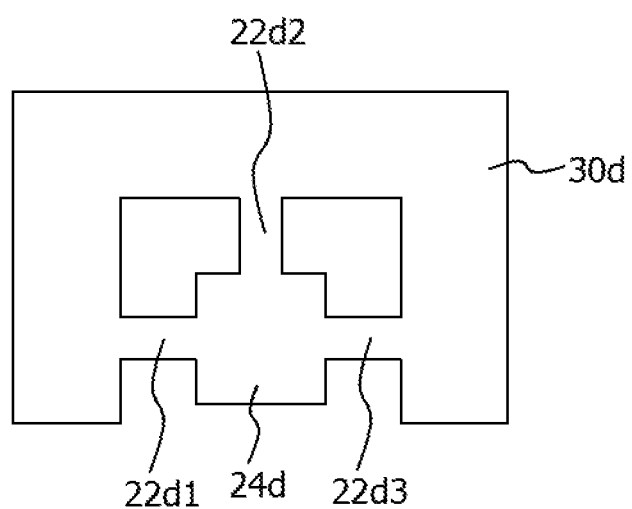
FIG. 14 is a view illustrating another example of a capacitor connected to a pad.

FIG. 14 is a view illustrating another example of a capacitor connected to a pad. As illustrated in FIG. 14, a capacitor connected to the pad 24d in three directions may be a U-shaped capacitor 30d surrounding the pad 24d in three directions. One terminal of the capacitor 30d is connected to the pad 24d via the wirings 22d1 to 22d3, and the other terminal is connected to the ground potential. As described above, the capacitor connected to the pad 24d in three directions may be the capacitors 30a to 30c that are separately provided as illustrated in FIG. 11, or may be one U-shaped capacitor 30d as illustrated in FIG. 14. By providing the capacitors 30a to 30c separately, it is possible to set each capacitance individually. Meanwhile, by providing a single capacitor 30d, manufacturing may be facilitated.

In the fourth embodiment, as an example, a case where the capacitors 30a to 30c are provided around the pad 24d connected to the drain of the transistor 12 is described. However, the present disclosure is not limited thereto. As in the second embodiment, when the pad 24f connected to the gate of the transistor 12 is formed, the capacitors 30a to 30c may be formed around the pad 24f.

Fifth Embodiment

Figure 15:
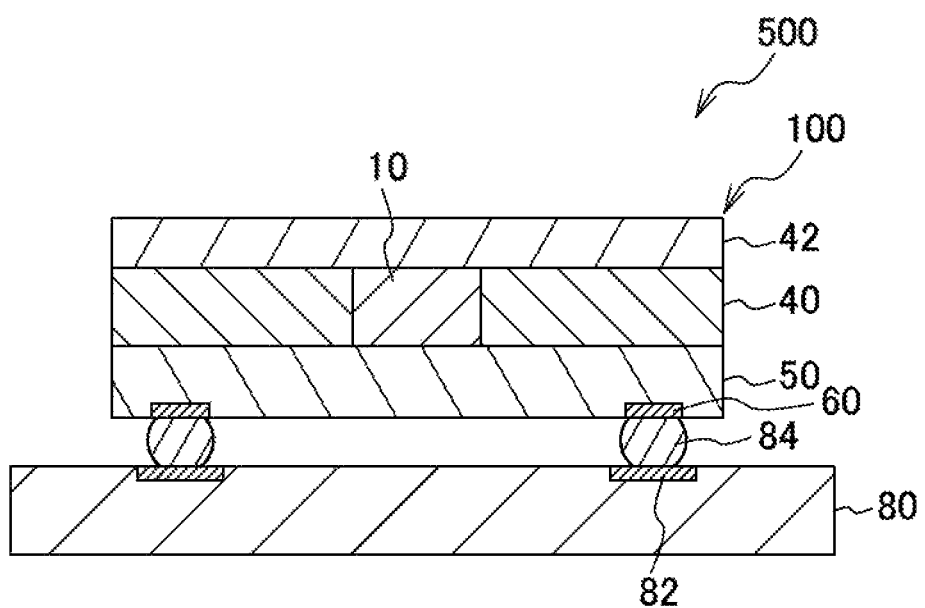
FIG. 15 is a cross-sectional view illustrating an amplifier related to a fifth embodiment.

FIG. 15 is a cross-sectional view illustrating an amplifier related to a fifth embodiment. As illustrated in FIG. 15, an amplifier 500 of the fifth embodiment includes a mounting board 80, and the semiconductor device 100 of the first embodiment which is mounted on the mounting board 80. The semiconductor device 100 is mounted on the mounting board 80 by bonding the pad 60 formed on the redistribution layer 50 to a pad 82 of the mounting board 80 by a solder 84. The mounting board 80 may be an antenna board having one or more radiation elements provided on the surface opposite to the surface on which the semiconductor device 100 is mounted. The mounting board 80 is formed by processing, for example, a substrate on which a glass epoxy resin of a flame retardant type 4 (FR-4) standard and a metal foil are laminated, or a substrate on which a ceramic and a metal foil are laminated. In FIG. 15, as an example, a case where the semiconductor device 100 of the first embodiment is mounted on the mounting board 88 is described, but the semiconductor devices in the second to fourth embodiments may be mounted on the mounting board 80.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device comprising:
an electric circuit configured to include:
a transistor,
a first pad coupled to a gate or a drain of the transistor,
a second pad coupled to the gate or the drain of the transistor,
a first wiring that extends horizontally from the gate or the drain of the transistor to the first pad, and
a second wiring that directly connects with and diverges from the first wiring and extends horizontally to the second pad; and
a redistribution layer formed over the electric circuit and configured to include:
a first redistribution coupled to the first pad, and
a second redistribution coupled to the second pad to constitute an open stub or a short stub.
2. The semiconductor device according to claim 1,
wherein the electric circuit includes a third pad, and
wherein the redistribution layer includes:
a first via that couples the second pad to one end side of the second redistribution, and
a second via that couples the third pad to an other end side of the second redistribution.
3. The semiconductor device according to claim 2,
wherein the electric circuit includes:
one or more third wirings that extends from the third pad, and
one or more capacitors coupled to the third pad via the one or more third wirings.

4. The semiconductor device according to claim 3,
wherein the one or more third wirings extends from the third pad in a direction different from a first direction in which the second wiring extends from the second pad.

5. The semiconductor device according to claim 3,
wherein the one or more third wirings corresponds to three third wirings that extend from the third pad,
wherein the three third wirings extend from the third pad in a second direction opposite to the first direction and in a third direction and a fourth direction that intersect the first direction, and
wherein the one or more capacitors are coupled to the third pad via the three third wirings.

6. The semiconductor device according to claim 5,
wherein the one or more capacitors corresponds to one capacitor that surrounds the third pad in a U-shape.

7. The semiconductor device according to claim 1,
wherein a bias voltage is supplied to the transistor via the second redistribution.

8. The semiconductor device according to claim 1,
wherein the electric circuit includes a capacitor coupled between the first pad and a branch point at which the second wiring diverges from the first wiring.

9. The semiconductor device according to claim 1,
wherein the first redistribution and the second redistribution constitute a matching circuit that performs an impedance matching of high frequency signals amplified by the transistor.

10. The semiconductor device according to claim 1,
wherein the electric circuit includes a substrate made of gallium nitride.

11. The semiconductor device according to claim 1,
wherein the transistor amplifies a high frequency signal.

12. An amplifier comprising:
a substrate configured to include:
an electric circuit configured to include:
a transistor configured to amplify a high frequency signal,
a first pad coupled to a gate or a drain of the transistor,
a second pad coupled to the gate or the drain of the transistor,
a first wiring that extends horizontally from the gate or the drain of the transistor to the first pad, and
a second wiring that directly connects with and diverges from the first wiring and extends horizontally to the second pad, and
a redistribution layer formed over the electric circuit and configured to include:
a first redistribution coupled to the first pad, and
a second redistribution coupled to the second pad to constitute an open stub or a short stub.

* * * * *